(12) United States Patent
Zoller (10) Patent No.: US 7,235,744 B2
(45) Date of Patent: Jun. 26, 2007

(54) COLLAR SCREW OR COLLAR NUT HOUSING ATTACHMENT

(75) Inventor: Ortwin Zoller, Altdorf (DE)

(73) Assignee: Hirschmann Electronics GmbH & Co. KG, Neckartenzlingen (DE)

( * ) Notice: Subject to any disclaimer, the term of this patent is extended or adjusted under 35 U.S.C. 154(b) by 202 days.

(21) Appl. No.: 10/887,238

(22) Filed: Jul. 7, 2004

(65) Prior Publication Data

US 2005/0006557 A1    Jan. 13, 2005

(30) Foreign Application Priority Data

Jul. 9, 2003    (DE)    ................... 103 31 011
Dec. 6, 2003    (DE)    ................... 103 57 095

(51) Int. Cl.
*A47G 29/00*    (2006.01)

(52) U.S. Cl. ............ 174/138 G; 174/135; 248/74.5; 248/686; 248/544; 403/329; 411/999; 411/970; 411/533

(58) Field of Classification Search ............ 174/138 G, 174/135; 248/74.5, 686, 544; 403/329; 411/999, 970, 533
See application file for complete search history.

(56) References Cited

U.S. PATENT DOCUMENTS 4,170,995 A * 10/1979 Levine et al. ............... 604/180
5,651,651 A * 7/1997 Spencer ................... 411/372.6

* cited by examiner

*Primary Examiner*—Jinhee Lee
(74) *Attorney, Agent, or Firm*—Andrew Wilford (57) ABSTRACT

A housing assembly for a printed circuit board is mounted on a vehicle body by pressing a collar nut or the head of a collar screw past a plurality of fingers of a housing assembly so that the fingers retain the nut or screw head in place. The module is then pressed against the vehicle body so that the collar nut or collar screw is lifted while the retainers are deflected outwardly and a tool is used to tighten the screw into a nut or the nut onto the shank of a screw to clamp the printed circuit board on the housing against the vehicle body.

11 Claims, 8 Drawing Sheets

COLLAR SCREW OR COLLAR NUT HOUSING ATTACHMENT

FIELD OF THE INVENTION

My present invention relates to a device for securing a collar nut or collar screw, hereinafter referred to generally as a screw element having a collar, upon a housing and especially a plastic housing. The invention relates also to a housing assembly as mounted on a support, e.g. an automotive vehicle body, to a method of mounting a housing assembly upon such a support and to an electronic module in which a housing assembly of the afore described type has a printed circuit board between a housing shell and further housing part, referred to interchangeably as first and second housing members.

BACKGROUND OF THE INVENTION

In the automotive vehicle field it is frequently required to attach various components to the vehicle body by screws. This is the case, for example, for electronic modules which may have a printed circuit board received in a housing and usually provided between a housing shell and another housing part, for example, a housing cover. As a practical matter, a screw can be driven through a hole in one of these housing members and into the vehicle body. However this method is not always possible and in many cases it is necessary either to hold a screw or nut by hand while the other screw element is rotated, e.g. by a socket wrench or the head of a driver which may have a normally flat screwdriver blade shape, a Phillips-head shape, an Allen wrench shape or a Torx head.

A problem in such cases is that the nut or screw can readily be dropped and either a new one must be provided or the dropped screw element must be found before it can be used to mount the housing in place.

OBJECTS OF THE INVENTION

It is therefore the principal object of the present invention to provide a housing assembly whereby the above-mentioned drawbacks can be avoided and the mounting of the assembly or an electronic module provided with the housing upon a support can be simplified.

Another object is to provide a method of mounting such an assembly or module upon a support especially an automotive body, which can simplify OEM applications and make the mounting operation less expensive.

SUMMARY OF THE INVENTION

These objects are attained, for example, in a housing assembly according to the invention which comprises:

a first housing member and a second housing member juxtaposed with the first housing member to form a module therewith;

a screw element having a collar and engageable through a wall of the first housing member and adapted to be engaged by a mating screw element for mounting the module on a support by rotation of the screw element having the collar; and a plurality of retainers elastically connected to the wall, bent toward the second housing member and engaging over the collar for retaining the screw element having the collar on the module.

The method of mounting the module can comprise the steps of:

assembling a first housing member, a second housing member juxtaposed with the first housing member, and a printed circuit board between the housing members to form a module, the first housing member having a wall provided with an opening and a plurality of resilient retainers extending into the opening and bent toward the second housing member;

inserting a screw element having a collar into the opening and past the retainers whereby the retainers engage over the collar;

setting the module on a support whereby a mating screw element on the support presses the screw element having the collar away from the printed circuit board and bends the retainers away from the printed circuit board;

inserting a tightening tool into engagement with the screw element having the collar, thereby deflecting the retainers away from the collar; and tightening the screw element having the collar onto the mating screw element with the tool.

More generally, the method can comprise the steps of:

assembling a first housing member and a second housing member juxtaposed with the first housing member to form a module, the first housing member having a wall provided with an opening and a plurality of resilient retainers extending into the opening and bent toward the second housing member;

inserting a screw element having a collar into the opening and past the retainers whereby the retainers engage over the collar;

setting the module on a support whereby a mating screw element on the support presses the screw element having the collar away from the support and bends the retainers away from support;

inserting a tightening tool into engagement with the screw element having the collar, thereby deflecting the retainers away from the collar; and tightening the screw element having the collar onto the mating screw element with the tool.

According to the invention, therefore, the retainers are elastically secured to one of the housing members, namely, the housing shell or the other housing part, e.g. by being formed in one piece therewith and are bent toward the interior of the housing, i.e. in the direction of the printed circuit hoard or the housing art or shell to lie against the support surface and are so arranged that they can engage behind the collar of the collar screw or collar nut.

Because of this configuration of the retainers, the screw or nut can be engaged by a tool, e.g. a flat blade driver, a Phillips driver, an Allen driver or a Torx driver, and tightened in or on the mating screw element, thereby pressing and clamping the housing assembly on the support. The screw element provided with the collar is pressed past the retainers which spring over the collar to hold the collar element on the housing assembly. Since the collar screw or collar nut is thereby retained, it can be put in place during fabrication of the module or even just before application of the module to the vehicle body and can thereby become a component of the module so that it will not be lost therefrom.

Advantageously a plurality of such retainers are uniformly distributed around the periphery of the screw or nut. Preferably there are three such retainers. This arrangement is especially desirable for collar nuts since, unlike collar screws, they can slip out of place if fewer retainers are provided. The uniform distribution of the retainers around the screw has been found to be highly advantageous for rapid and reliable attachment of the module to a vehicle body.

To enable the screw or nut to form a conductive contact with the printed circuit board and thus form a ground for the printed circuit board, the recess in the portion of the housing formed with the retainers can have wall portions extending between the retainers which are cylindrically concave, set back from the collar and define a compartment which opens toward the printed circuit board and thus enables the collar nut or collar screw to bear directly upon the printed circuit board. This has the further advantage that the screw head or nut can be located within the outer contour of the housing module and thus be fully recessed therein. The cylindrical wall portion also provides additional guidance for the head of the screw or the nut and facilitates the insertion of the latter.

To ensure an appropriate elasticity of the retainers, cutouts are provided between the retainers and the cylindrical wall portions or segments. The cutouts delimit the wall segment and cantilever the retainers, i.e. the bent fingers, from the wall of the housing between the segments.

The retainers can have an S-shaped corrugated portion between their attachments to the housing wall and the fingers to facilitate deflection of the fingers over the entire length thereof and not only at the junction of each finger with the housing wall. The entire retainer is thus elastically deflectable. This allows, for example, insertion of a socket of a socket wrench between the fingers and deflection of the fingers upon insertion of such socket. The S-shaped corrugated region deposits even significant deformation forces to prevent tearing of the retainers or breaking thereof.

According to a feature of the invention, the housing shell and cover can be connected together via a film hinge. This also facilitates mounting since the housing then becomes one piece and can be more readily handled. The housing may be simply closed by pivoting the two housing parts about the film hinge.

At least at one location along the length of the retainer, each retaining element an have a thickness reduction. The thickness reduction alone or together with the S-shaped corrugated region can serve to improve the spring effectiveness of the retainer. The reduction can be made during fabrication of the retainer or can be made afterward, e.g. by removal of material. Depending upon the degree of reduction, the spring force can be set or adjusted.

The arresting of the collar screw or nut in the housing permits the attachment of the module to the body of an automobile in a very simple manner. After the module is fabricated, one or more collar screws or collar nuts are inserted into the recesses past the retainer fingers. The retainer fingers spring back over the collars to hold the screw elements in place. This can be done on fabrication of the housing or the module. It is also possible to press the screws or nuts into place just prior to mounting.

To mount the module, the module is pressed against the support surface, i.e. the vehicle body, so that the mating pressing element presses the retained nut or screw away and thus lifts the collar nut or head of the collar screw from the printed circuit board. A tool can then be engaged with that head or nut and rotated to tighten the screw into the nut or the nut onto a screw until the printed circuit board is once more engaged and clamped through the housing shell onto the vehicle body. The tool can deflect the retaining fingers outwardly during this step.

BRIEF DESCRIPTION OF THE DRAWING

The above and other objects, features, and advantages will become more readily apparent from the following description, reference being made to the accompanying drawing in which.

SPECIFIC DESCRIPTION

FIGS. 1–7 illustrate a module 1 to be mounted on a support, for example, a wall of an automobile, the device 1 being, for example, an antenna amplifier or other electronic unit having a printed circuit board 4 (FIG. 4) received between a housing part 3 and a housing shell 2 together forming a housing for the printed circuit board. Screws or the like at 3a may hold the housing together and sockets may be provided at 3c to receive plugs for electronic devices to be connected to the printed circuit board. Lugs 3c may likewise be printed to make electrical connections for the circuitry.

The details of the housing structure and that of the printed circuit board are not important for the purposes of the invention.

What is important is that in the housing part or member 3, having a wall 3d closing the interior 3e of the housing, a plurality of threaded or screw elements 12 are mounted, e.g. in the form of collar nuts which serve to enable the module 1 to be mounted on a support, such as a vehicle wall 13 from which a mating screw element, such as the screw 14 (FIGS. 6 and 7) can project.

Figure 5:
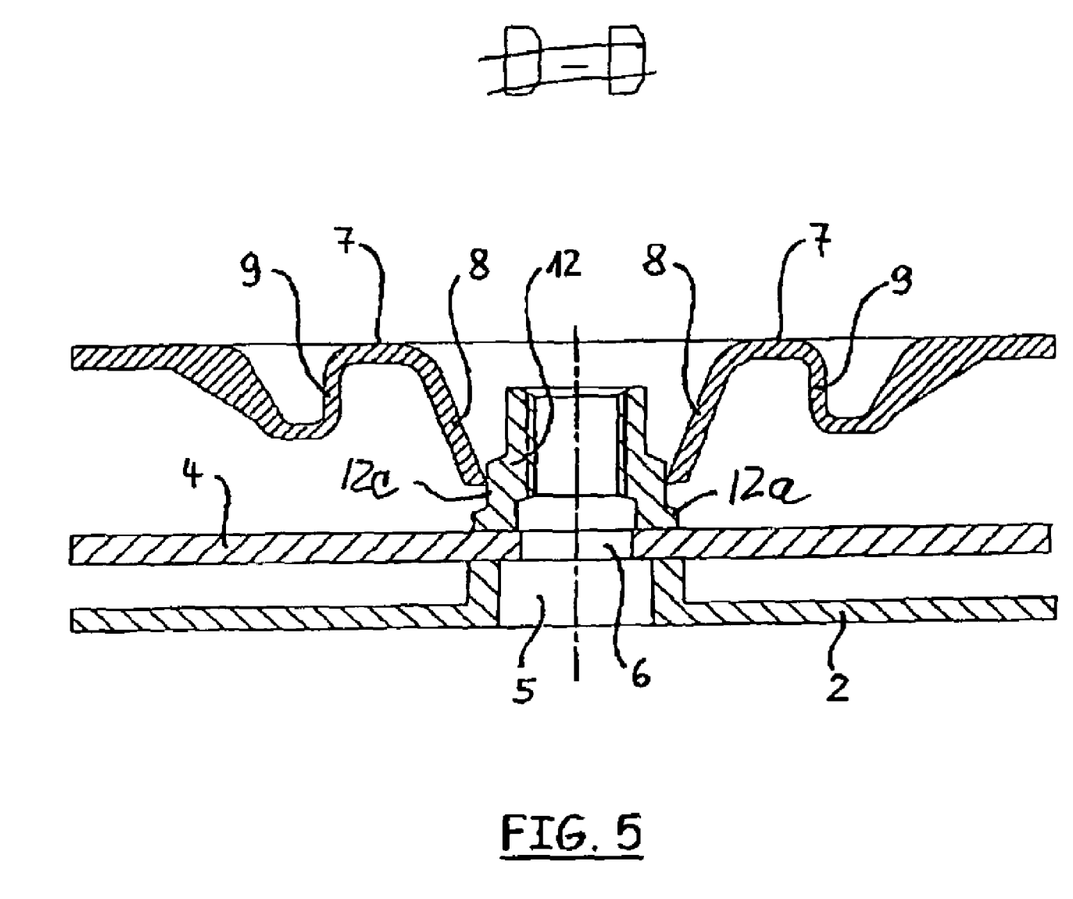
FIG. 5 is a cross sectional view corresponding to the section of FIG. 4 but with the collar nut in place.
Figure 6:
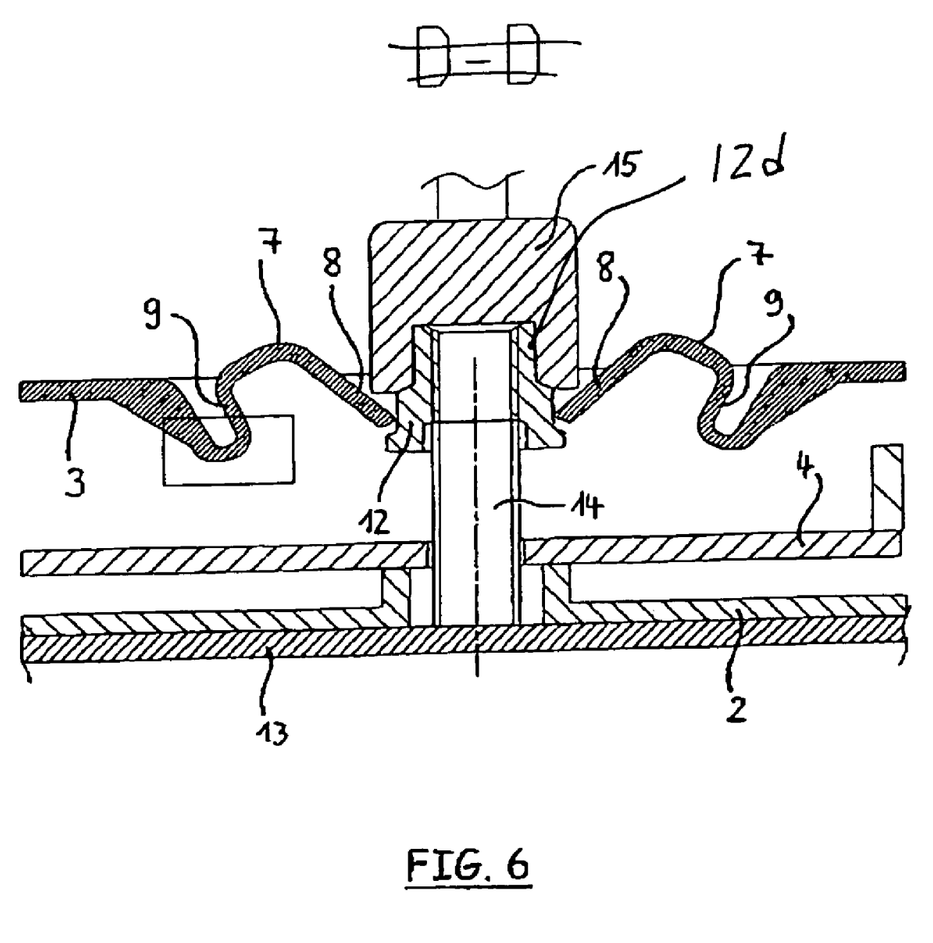
FIG. 6 is a cross sectional view likewise corresponding to the section of FIG. 4 but showing the mounting of the module on a support from which a screw projects.
Figure 7:
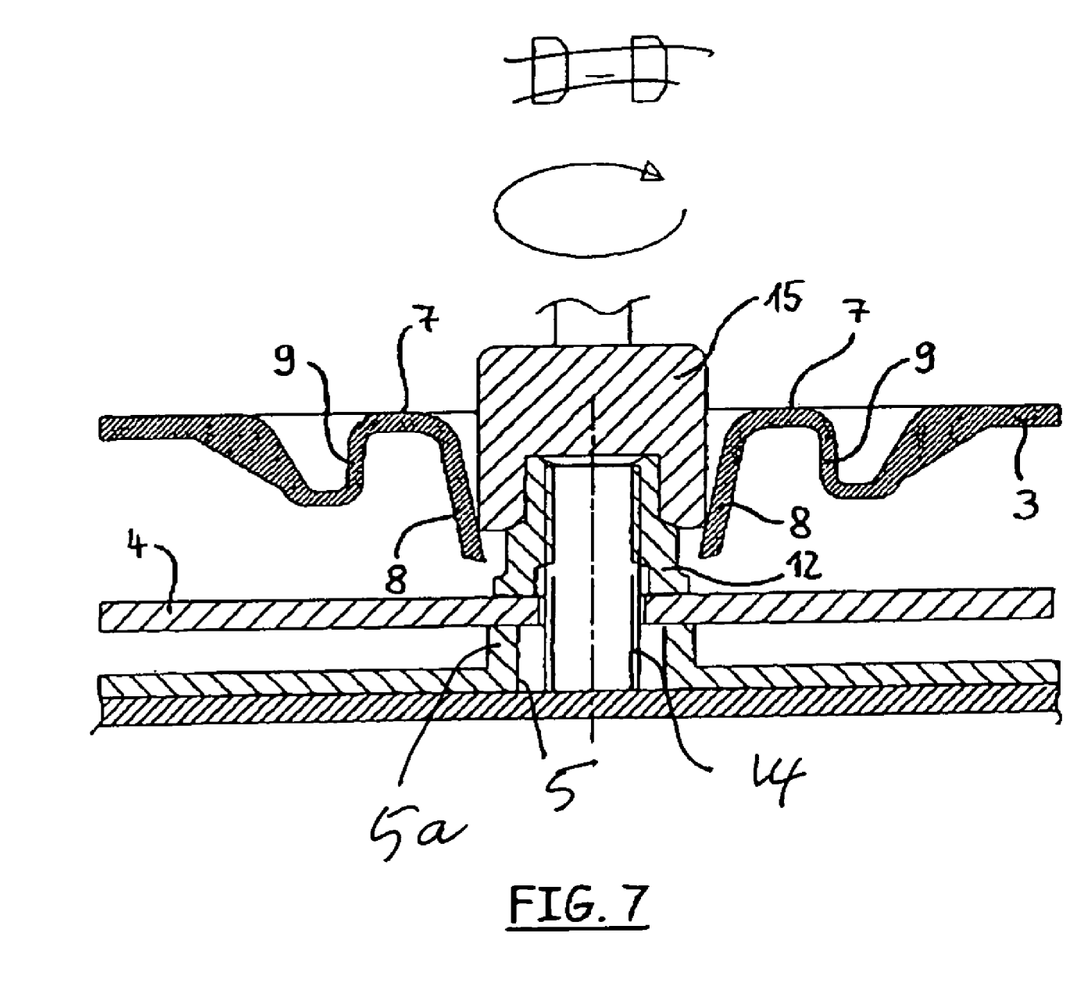
FIG. 7 is yet another cross section in the same region showing the tightening of the nut on a screw.

The housing part 2 can be provided with an opening 5 through which the screw can project in alignment with the hole 6 in the printed circuit board with a passage 11 in the wall 3d through which the collar nut 12 can be inserted to rest against the printed circuit board 4 directly (FIG. 5).

Figure 1:
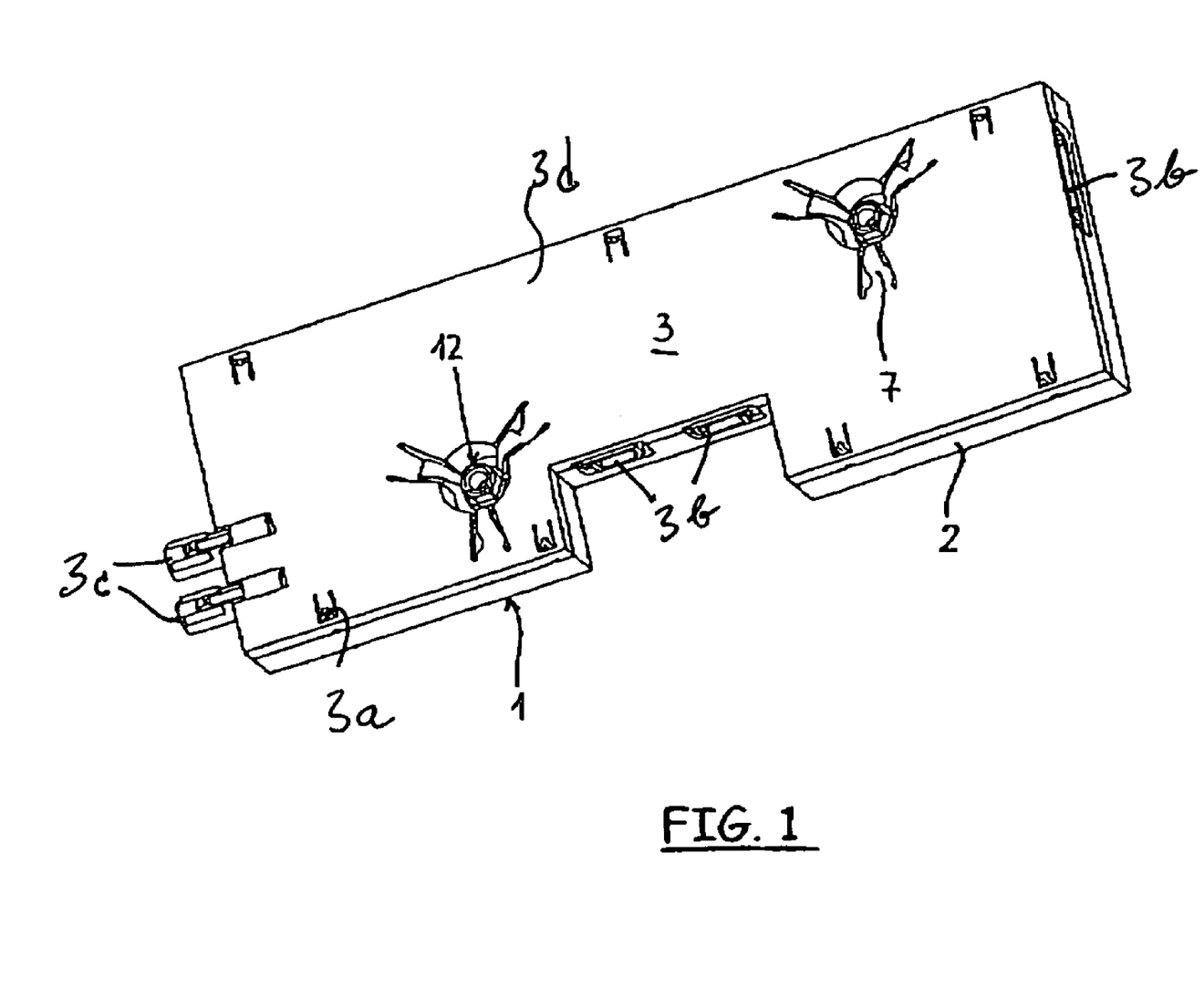
FIG. 1 is a perspective view of a housing module for a printed circuit board with collar nuts inserted therein for the mounting of the housing module on a support.
Figure 2:
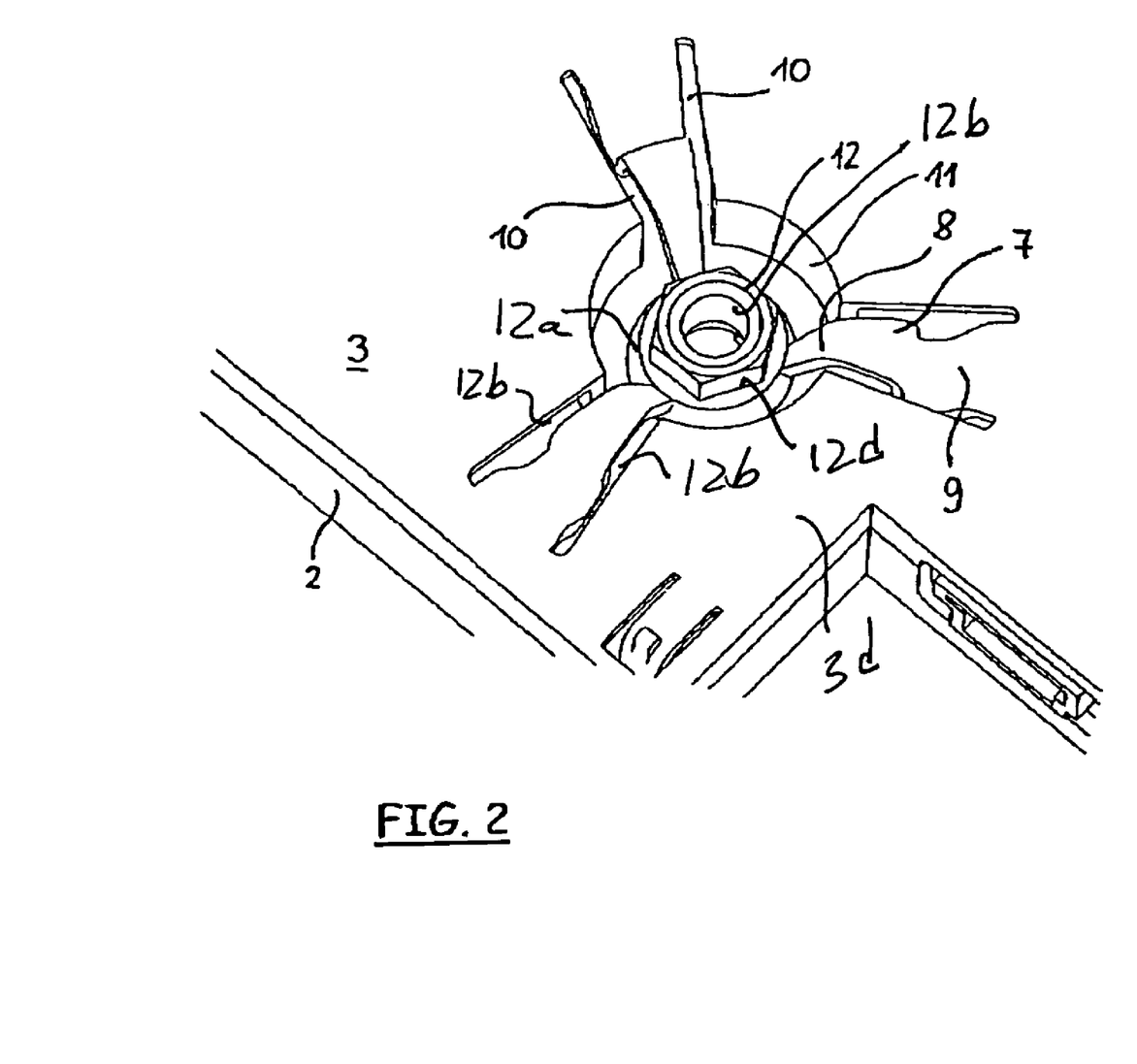
FIG. 2 is a detail showing the collar nuts and the retainers to a larger scale.
Figure 3:
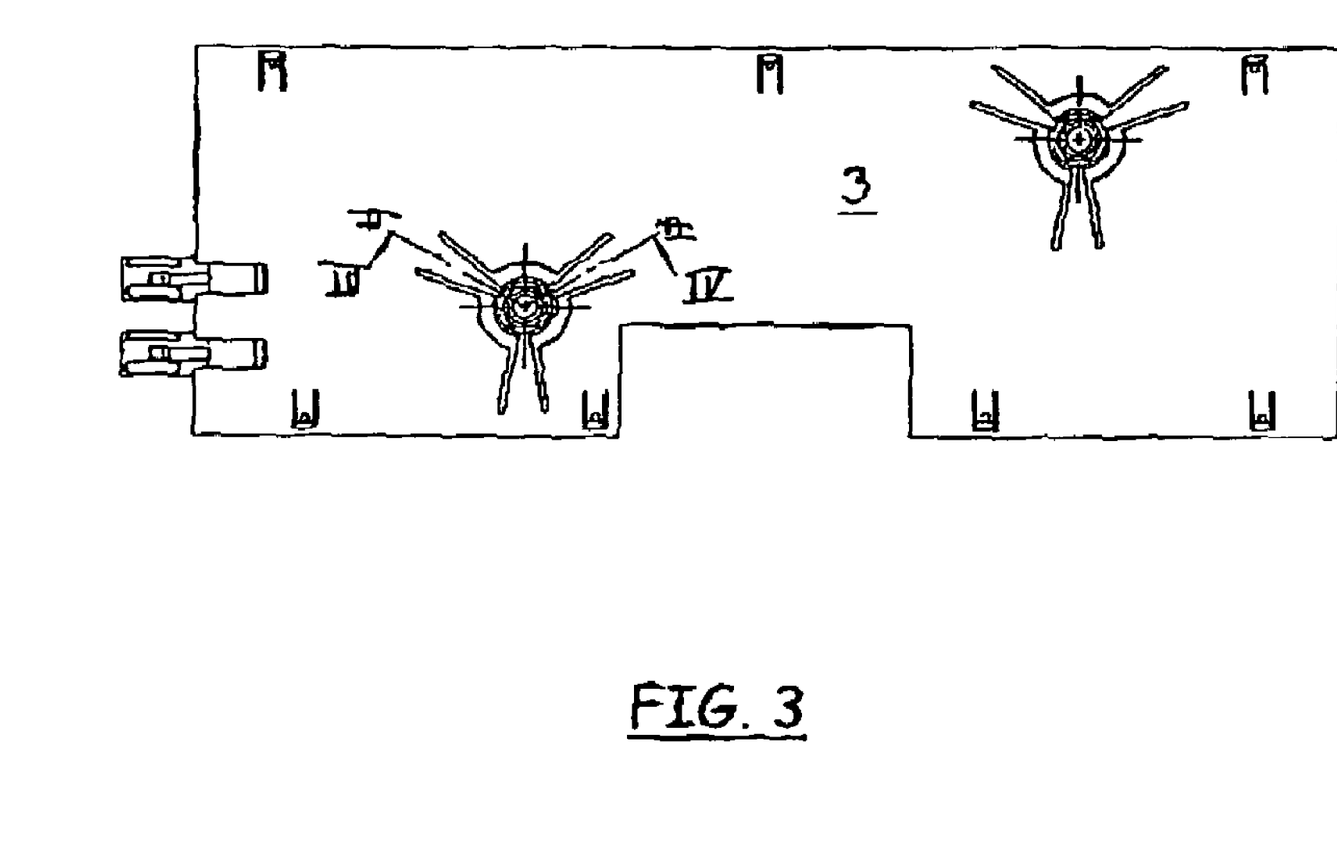
FIG. 3 is a plan view of the housing module.

The collar nut is held in place by a plurality (at least three) of angularly equispaced resilient retaining fingers 8 which, as can be seen from FIG. 2, engage over the collar 12a of the nut 12.

Figure 4:
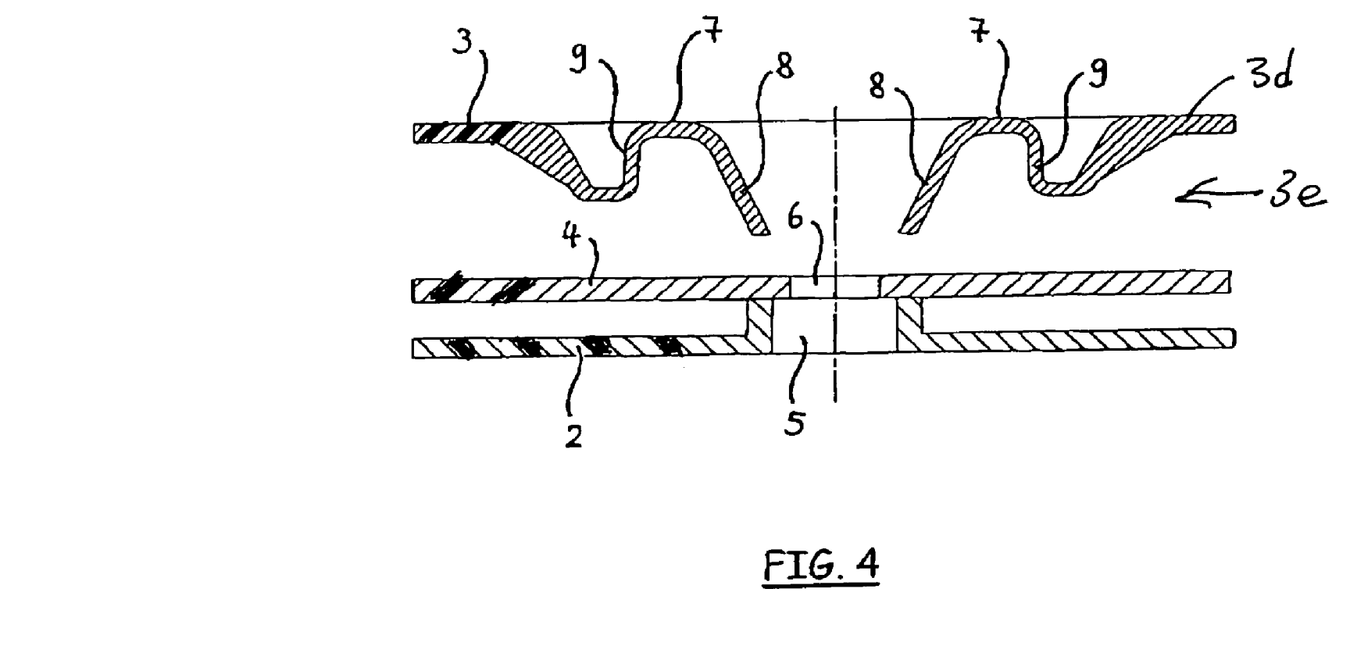
FIG. 4 is a cross sectional view taken generally along the line IV—IV of FIG. 3 without the collar nut, i.e. prior to insertion of the collar nut beneath the retainers.

The fingers 8 form terminal elements of retainers 7 which are separated from the remainder of the wall 3d by slits 12b but are connected to the wall by rear portions 9 which are bent and molded to have an S shape (compare FIGS. 2 and 4).

Between the retainers, the wall 3d is set back to form the opening 11.

Figure 4A:
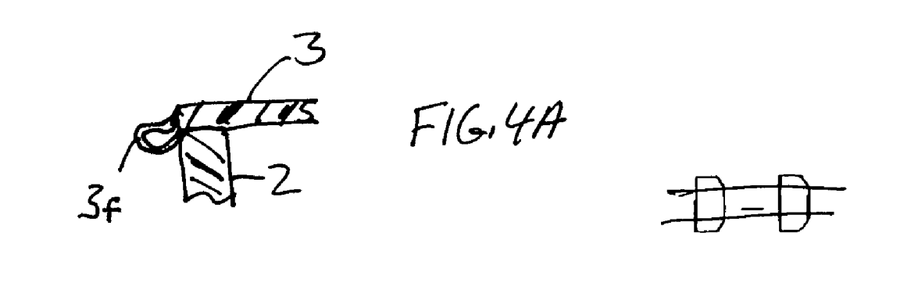
FIG. 4A is a detail of FIG. 4.

The housing parts 2 and 3 can, in addition, be interconnected by a film hinge as represented at 3f in FIG. 4A in an exaggerated manner.

In the opening in the housing wall 3d formed by the concave wall segments 11, a screw element formed with a collar, can be inserted through the wall 3d to lie against the printed circuit board 4 with its internally threaded portion 12b in alignment with a hole 6 in the printed circuit board and a passage 5 in the bottom wall of the housing shell 2 (see FIG. 4). The nut 12 is so inserted that its collar 12a is forced past the fingers 8 so that the fingers engage over the collar and retain the nut in position as shown in FIG. 5. In this position, the retaining fingers 8 are still held spread by a step 12c of the nut but have sprung inwardly over the collar 12a. For mounting the module on a wall 13 of an automotive vehicle which has previously been provided with a threaded tin or screw 14, the module is pressed into position against the wall 13 (FIG. 6) so that the screw 14 will lift the collar nut 12 and thus deflect the retaining fingers upwardly. A tool 15 can then be applied to the nut. The tool 15 is here shown to be the socket of a socket wrench which can be fitted over the hexagonal portion 12d of the nut. The tool 15 is then rotated to spin the nut 12 onto the screw 14 (FIG. 7) until the nut tightens against the printed circuit board and the printed circuit board is held against the nut of a boss 5a surrounding the hole 5. As the socket 15 moves toward the printed circuit board 4, it deflects the fingers 8 outwardly as has also been shown in FIG. 7.

Figure 8:
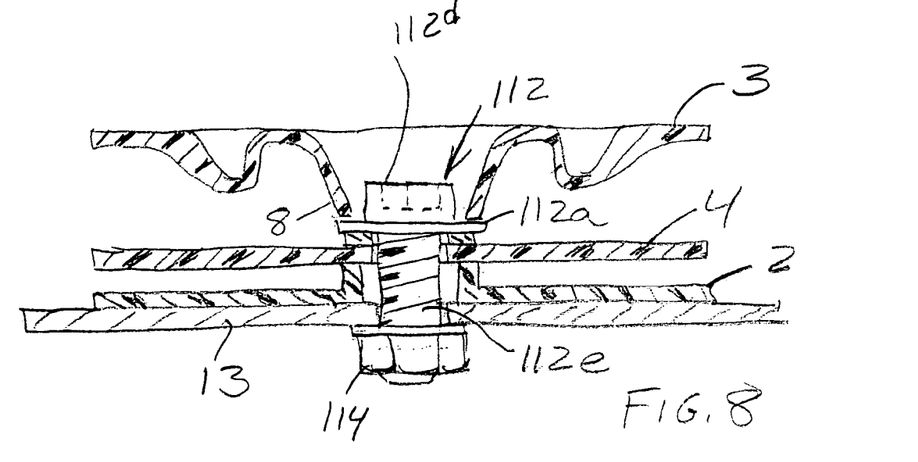
FIG. 8 is a cross sectional view showing an arrangement in which a collar screw is held by the retainers.
Figure 9:
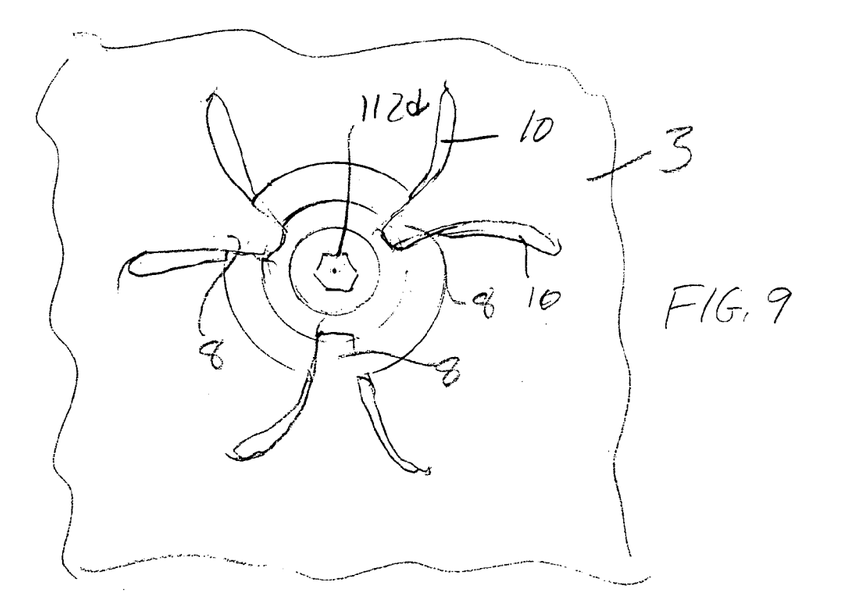
FIG. 9 is plan view of a portion of a housing module with the screw in place as in FIG. 8.

FIG. 8 and 9 show kinematic reversal of the configuration in FIGS. 1–7 and in this embodiment, the fingers 8 of the wall of housing part 3 engage a collar 112a of a screw 112 which is shown to have an internal hex head 112d engageable by an Allen wrench which can tighten the screw 112 so that its shank 112e will thread into a nut 14 mounted on the underside of the support 13. Alternatively, the shank 112e can be a self-tapping screw which forms the mating thread as it bites into the sheet metal 13. In this embodiment as in that of FIGS. 1–7, the fingers 8 are separated by slits 10 from the wall of the housing member 3.

I claim:

1. A housing assembly comprising:
    a first housing member and a second housing member juxtaposed with said first housing member;
    a printed-circuit board received between the first and second housing members and forming a module therewith;
    a screw element having a collar and engageable through a wall of said first housing member and adapted to be engaged by a mating screw element for mounting said module on a support by rotation of the screw element having said collar; and
    a plurality of retainers elastically connected to said wall, bent toward said second housing member and engaging over said collar for retaining said screw element having said collar on said module.

2. The housing assembly defined in claim 1 wherein said housing members are composed of a plastic, said retainers are formed integrally with said wall.

3. The housing assembly defined in claim 2 wherein at least three of said retainers are provided in angularly equi-spaced relationship around said screw element having said collar.

4. The housing assembly defined in claim 3 wherein between said retainers said first housing member is formed with concave wall segments extending inwardly of the module toward said printed circuit board.

5. The housing assembly defined in claim 4 wherein slits are provided between said retainers and said wall segments or the wall of said first member, thereby separating said retainers from said wall.

6. The housing assembly defined in claim 5 wherein said wall segments define a generally circular space into which said retainers project as resilient fingers and in which said screw element having said collar is received and can be tightened against said printed circuit board.

7. The housing assembly defined in claim 6 wherein each of said retainers has an S-shaped region of wavy configuration connecting each of said fingers with said wall.

8. The housing assembly defined in claim 1 wherein said members are connected by a film hinge.

9. The housing assembly defined in claim 1 wherein said retainers each have at least one zone of reduced thickness.

10. The housing assembly defined in claim 1 wherein said screw element having said collar is a collar nut.

11. A housing assembly comprising:
    a first plastic housing member having a wall;
    a second plastic housing member juxtaposed with the first housing member;
    a printed-circuit board between the first and second housing members and forming a module therewith;
    a first screw element having a collar and engageable through the wall of the first housing member;
    a second screw element mating with the first screw element for mounting the module on a support by rotation of the first screw element; and
    a plurality of retainers integrally formed with and elastically connected to the wall, bent toward the second housing member and engaging over the collar for retaining the first screw element having the collar on the module.

* * * * *